(12) United States Patent
Nishigaki et al.

(10) Patent No.: US 7,062,495 B2
(45) Date of Patent: Jun. 13, 2006

(54) DESIGN WORK ASSISTANCE APPARATUS

(75) Inventors: Ichiro Nishigaki, Ishioka (JP); Hiroyuki Nemoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 504 days.

(21) Appl. No.: 10/358,170

(22) Filed: Feb. 5, 2003

(65) Prior Publication Data
US 2003/0195900 A1    Oct. 16, 2003

(30) Foreign Application Priority Data
Apr. 11, 2002    (JP)    ............... 2002-108971

(51) Int. Cl.
*G06F 17/30*    (2006.01)
(52) U.S. Cl. ............... 707/100; 707/2; 709/201; 715/964
(58) Field of Classification Search ............... 707/8, 707/100, 102, 104.1, 1–3, 10; 715/500, 964; 709/201, 203, 227; 706/919
See application file for complete search history.

(56) References Cited

U.S. PATENT DOCUMENTS

| | | | | |
|---|---|---|---|---|
| 5,999,911 A | * | 12/1999 | Berg et al. ............... | 705/9 |
| 6,116,766 A | * | 9/2000 | Maseeh et al. ............... | 700/97 |
| 6,167,405 A | * | 12/2000 | Rosensteel et al. ......... | 707/102 |
| 6,167,410 A | * | 12/2000 | Imamura ............... | 715/530 |
| 6,301,584 B1 | * | 10/2001 | Ranger ............... | 707/103 R |
| 6,889,101 B1 | * | 5/2005 | Gudmundsson et al. ...... | 700/97 |
| 2002/0099461 A1 | * | 7/2002 | Anami et al. ............... | 700/97 |

FOREIGN PATENT DOCUMENTS

| | | |
|---|---|---|
| JP | 6-19691 | 1/1994 |
| JP | 10-240778 | 9/1998 |

* cited by examiner

*Primary Examiner*—Greta Robinson
*Assistant Examiner*—Cheryl Lewis
(74) *Attorney, Agent, or Firm*—McDermott Will & Emery LLP (57) ABSTRACT

A design work assistance apparatus, comprising: a design work guidance means for guiding along with a process template, which represents processing steps of design work process by unit work processes in a sequence thereof; a design work history accumulation means 107 for accumulating data of design work history, in particular information relating to failures in the past, by referring to a predetermined unit work process in parallel with the design work guidance; and a knowledge visualizing means 108 for transmitting information, which has high importance among the accumulated data of the design work history (for example, a failure case), to a design worker, thereby achieving the design work guidance with utilizing the cases of the past design works effectively.

14 Claims, 10 Drawing Sheets

[PROCESS TEMPLATE COMMON DATA]
- TEMPLATE NAME
- PRODUCER'S NAME OF TEMPLATE
- NAME/TITLE OF DESIGN WORK
- WORKER'S NAME
- KEY WORD FOR SEARCHING PROCESS TEMPLATE
- MESSAGE

302

[UNIT PROCESS DATA]
- NAME/TITLE OF UNIT PROCESS
  - SUMMARY OF WORK CONTENT
  - [REFERENCE]
    - NAME/TITLE OF REFERENCE FILE
      - STORAGE PLACE OF REFERENCE FILE
      - NAME/TITLE OF USING SOFTWARE TOOL
      - IMPORTANCE
  - [PRODUCTION DOCUMENT]
    - NAME/TITLE OF PRODUCTION FILE
      - STORAGE PLACE OF PRODUCTION FILE
      - NAME/TITLE OF USING SOFTWARE TOOL
      - IMPORTANCE
      - PRODUCTION TERM
  - [DESIGN WORK TOOL/DATABASE]
    - NAME/TITLE OF DESIGN WORK TOOL
    - NAME/TITLE OF DATABASE
  - [PROGRESS INFORMATION]
    - STARTING DATE (TARGET)
    - FINISHING DATE (TARGET)
    - NUMBER OF STEPS (TARGET)
    - STARTING DATE (ACTUAL)
    - FINISHING DATE (ACTUAL)
    - NUMBER OF STEPS (ACTUAL)

303

[PROCESS SEQUENCE/HIERARCHY DATA]
- PROCESS NAME/TITLE 1     PROCESS FINISH FLAG
- PROCESS NAME/TITLE 2     PROCESS FINISH FLAG
- PROCESS NAME/TITLE 3     PROCESS FINISH FLAG
-

DESIGN WORK ASSISTANCE APPARATUS

BACKGROUND OF THE INVENTION

The present invention relates to a design work assistance apparatus for assisting rationalized and high effective design work, with using a computer, a database and various kinds software tools, and in particular, to a design work navigation technology for guiding the design work, by accumulating and effectively practicing useful information relating to the design work.

With advancement in circumstances of the computers in recent years, such as a personal computer and/or a network, etc., for example, it is very often to progress the design work, with using such the computer circumferences and/or various kinds of software, in the manufacturing industries.

The followings are used in the design works; such as, a three dimensional (3-D) CAD (Computer Aided Design) system for producing a product configuration in a form of a configuration model data, a CAE (Computer Aided Engineering) system for estimating and/or testing performances and/or reliability of a product through a numeral analytic simulation, with using the configuration data, a document producing tool for producing a design data, and/or a product specification, a database system for accumulating the design documents into a database, and a search visualizing tool for enabling reference to information necessary for the design works, from various kinds of databases, etc.

There are two (2) ways or manners to use the software, which are utilized in the design works, effectively and correctly, as below.

A first one is a method of putting commands together in one (1) screen, such as, a start command for initializing a software tool necessary to the design work and an access command for accessing to the design data, for example, thereby enabling execution of the software tool mentioned above and reference/registration of the design data from that screen.

This first method generally is called by "portal". Icons for various kinds of commands are displaced in the portal screen, so that a designer is able to start the necessary software tool, and/or to refer to the design data, via picking of the icons.

As a result of that, it is possible to reduce complicated job, such as, initializing processes of the various kinds of software tools and/or document search from the databases scattered, for example.

A second one is a method, in which definition is made on contents and steps of the design work in a form of a template, thereby guiding the design work along with the steps described in that design template.

Icons are disposed on the design template in an order of works, each being indicative of contents in each work process, which is displayed on an operation screen, and the design worker advances the design work by picking the icons along that order of works.

Definitions are made previously, on software tools, which are necessary to this work, materials to be referred, and formats of materials to be produced, in the each work process. When picking the icon of the work process, the design worker can use the software tools and the related materials, which are defined therein.

The second method, comparing to the first method, is able to restrict the necessary software tools and the related materials by a unit of design work.

A system for assisting producing work of a design drawing with using design process information is described in Japanese Patent Laying-Open No. Hei 6-19691 (JP-A 19691 (1994)), for example.

However, the design work assisting apparatus with using the conventional software system has the following drawbacks:

First, though the conventional design work assisting apparatus is able to show the information about the steps of work and the contents of work, which are set up previously, to the design worker clearly, however it cannot indicate the cautious matters to the design worker in advance, not to cause failure in the process of design work.

For this reason, it is impossible to use a teaching of the failure effectively in a next design work, if the similar failure occurs in the past design work, as the software system.

With the conventional design assisting apparatus, though it is possible to investigate the cautious matters relating to the failure, briefly, thereby to make up them into information to be referred to necessarily, however it is limited only within a region of the failures, which can be supposed. And, it is also difficult to specify a scene of giving attention.

Second, information relating to the case of failure (such as, a result of failure, acause, and history reaching to the failure, etc.) cannot be accumulated easily; therefore other works are necessary after completion of the design work, such as collecting information relating to the failure case and analyzing thereof.

Those works need a lot of time and labor, and an important failure case takes priority to the others, therefore it is very often that a small failure overlooked, which occurs at high frequency.

For example, jobs are necessary, such as, collecting the information relating to the failure case and analyzing it again, after completion of the design work, with the method, in which the design work information of each designer is merged, thereby owning in common, as is described in Japanese Patent Laying-Open No. 10-240778 (JP-A 240778 (1998)).

BRIEF SUMMARY OF THE INVENTION

An object, according to the present invention, is to provide a design work assistance apparatus, comprising means, while accumulating information relating to a design work history, in particular, a failure case, for generating an attention to the design worker in advance and timely, so that the same failure will not be repeated upon the basis of the accumulated information.

The object mentioned above, according to the present invention, is achieved by a design work assistance apparatus, comprising: a design work guidance means for guiding along with a process template, which represents processing steps of design work process by unit work processes in a sequence thereof; a design work history accumulating means for accumulating data of design work history by relating it to a predetermined unit work process in parallel with the design work guidance; and a knowledge visualizing means for transmitting information, which has high importance among the accumulated data of the design work history (for example, a failure case), to a design worker.

According to the present invention, for achieving the object mentioned above, in the design work assistance apparatus, for guiding design work, sequentially, along a process template defining steps of the design work therein, wherein the design work history accumulating means accumulates a design document, when a worker selects a unit process other than a next coming unit process, which is produced or referred in process of the design work up to just before the selection, by relating it to either one of said two (2) unit processes, being in an upper stream from the other.

According to the present invention, it is possible to guide the design work, with effectively utilizing the design work cases of the past, since the design documents are accumulated, which are produced or referred to in the design work processes just before the selection, with being related to either one of two (2) unit processes mentioned above, being in an upper stream than the other.

According to the present invention, in the design work assistance apparatus, for guiding design work, sequentially, along a process template defining steps of the design work therein, wherein a design work history accumulating means produces a copy of a process template, which describes work history up to a unit process A therein, and accumulates the process template copied, by relating it to a unit, process B, when turning back to the unit process B before the unit process A under working.

According to the present invention, it is possible to guide the design work, with effectively utilizing the design work cases of the past, since the copy is produced on the process template, which describes work history up to the unit process A therein, and the process template copied is accumulated, with being related to the unit process B.

Further, according to the present invention, the design work history accumulating means accumulates information relating to a reason and/or cause of turning back thereto, when turning back to the unit process B before the unit process A under working, by relating it to the unit process B.

It is possible to guide the design work, with effectively utilizing the design work cases of the past, when turning back to a unit process B before the unit process A under working, since the information relating to the reason or cause of turning back to the unit process B is accumulated in the database, with being related to the unit process B, in particular, being accumulated the information relating to the failure case into the database.

According to the preset invention, there is further provided a design work assistance apparatus, for guiding design work, sequentially, along a process template defining steps of the design work therein, comprising: a design work history accumulating means for producing a copy of a process template, which describes work history up to a unit process C therein, and accumulating the process template copied, by relating it to a unit process A, when advancing to the unit process C by jumping over at least one unit process from the unit process under working.

It is possible to guide the design work, with effectively utilizing the design work cases of the past, since a copy is made on the process template, which describes the work history up to the unit process C therein, and since the copied process template is accumulated into the database, with being related to the unit process A.

It is also possible to provide the design work assistance apparatus, as described in the above, wherein the design work history accumulating means accumulates information relating to a reason and/or cause of omitting the unit processes up to the unit process C, when advancing to the unit process C by jumping over at least one unit process from the unit process under working, by relating it to the unit process A.

It is possible to guide the design work, with effectively utilizing the design work cases of the past, since the information relating to the reason and/or cause of omitting the unit process up to the unit process C is accumulated into the database, with being related to the unit process A, in particular, being accumulated the information relating to the failure case into the data base.

According to the present invention, there is also provided a design work assistance apparatus, for guiding design work, sequentially, along a process template defining steps of the design work therein, comprising: a design work history accumulating means for producing a copy of a process template, which describes work history up to a unit process A therein, and accumulating the process template copied, by relating it to a unit process B, when turning back to a unit process B before the unit process A under working, and for producing a copy of a process template, which describes work history up to a unit process C therein, and accumulating the process template copied, by relating it to the unit process A, when advancing to the unit process C by jumping over at least one unit process from the unit process A under working.

It is possible to guide the design work, with effectively utilizing the design work cases of the past, since a copy is made on the process template, which describes the work history up to the unit process A therein, and the copied process template is accumulated into the database, with being related to the unit process B, and also since a copy is made on the process template, which describes the work history up to the unit process C therein, and the copied process template is accumulated into the database, with being related to the unit process A.

It is also possible to provide the design work assistance apparatus, as described in the above, wherein said design work history accumulating means accumulates information relating to a reason and/or cause of turning back thereto, when turning back to the unit process B before the unit process A under working, by relating it to the unit process B, and accumulates information relating to a reason and/or cause of omitting the unit processes up to the unit process C, when advancing to the unit process C by jumping over at least one unit process from the unit process under working, by relating it to the unit process A.

It is possible to guide the design work, with effectively utilizing the design work cases of the past, since the information relating to the reason and/or cause of omitting the unit process up to the unit process B is accumulated into the database, with being related to the unit process B, and also since a copy is made on the process template, which describes the work history up to the unit process C therein, and the copied process template is accumulated into the database, with being related to the unit process A, in particular, being accumulated the information relating to the failure case into the database.

Furthermore, according to the present invention, there is provided the design work assistance apparatus, in any one as described in the above, further comprising a knowledge visualizing means for transmitting the design history information of the past, which is related to said unit process, when the user starts working of the unit process.

With the provision of the knowledge visualizing means for transmitting to the user the design history information of the past, which is related to the unit process mentioned above, when the user starts working of the unit process, it is possible to prompt an attention to the design worker, in particular to transmit such the information that he/she will not repeat the failure of the past, in advance thereof and timely.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE INVENTION

Hereinafter, embodiments according to the present invention will be fully explained by referring to the attached drawings, i.e., FIGS. 1 to 10.

1. System Configuration of Design Work Assistance Apparatus

Figure 1:
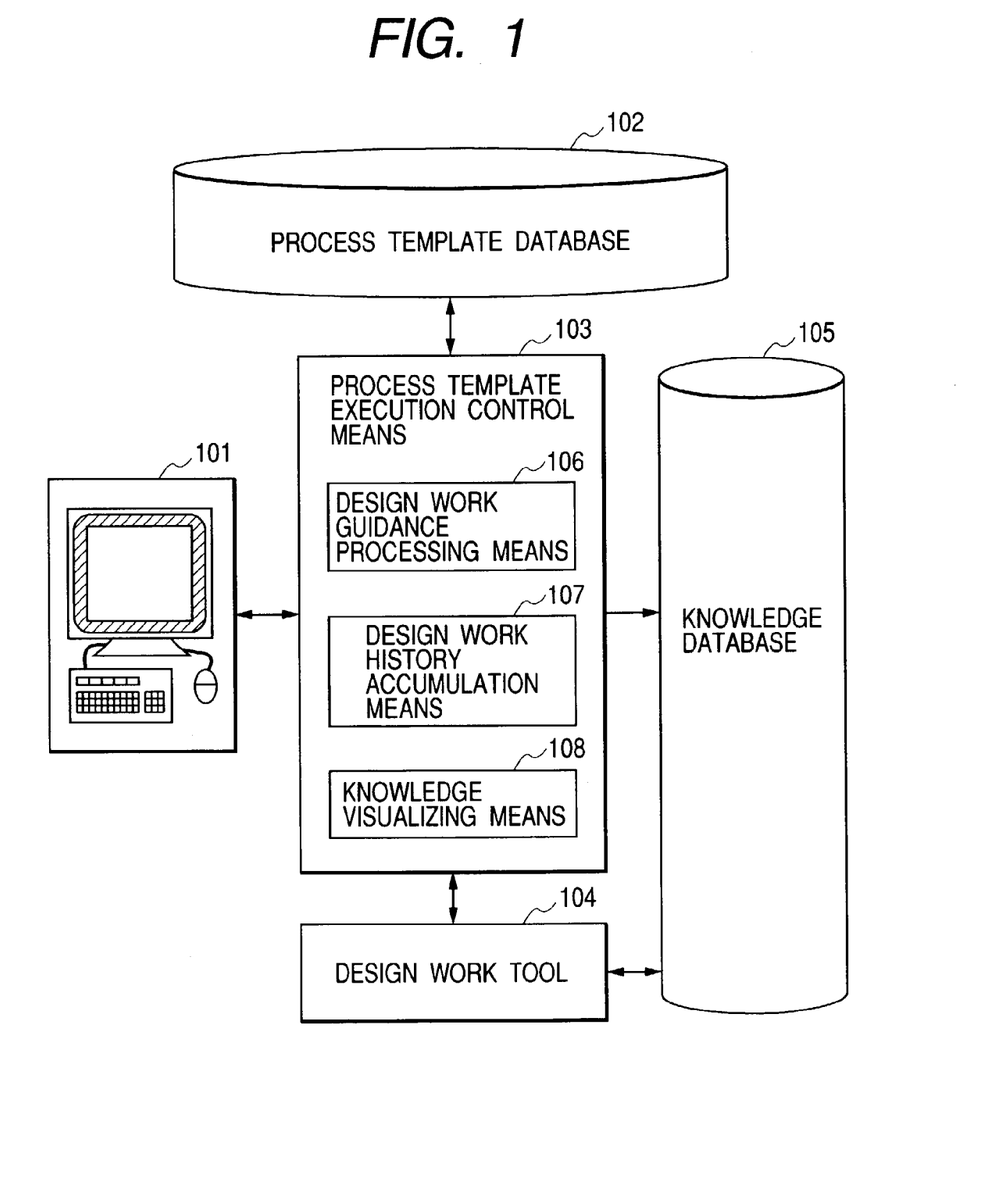
FIG. 1 is a block diagram for showing the system configuration of an embodiment of a design work assisting apparatus, according to the present invention.

FIG. 1 is a block diagram for showing the system configuration of an embodiment of the design work assistance system, according to the present invention.

The design work assistance apparatus comprises, according to the present embodiment, an input/output means 101, being made of, such as, a keyboard, a mouse and a display, etc., through which a system user inputs and/or displays data; a process template database 102, for storing process templates therein, each describing various kinds of design work processes; a process template execution control means 103, for guiding the design work along with the process template, which is selected from the process template database 102; a design work tool 104, being made of, such as, a document producing tool, an engineering tool, and a design material referring tool, etc., for example; and a knowledge database 105, for storing materials and data therein, which are produced by means of the design work tool 104.

The process template execution control means 103 is made up with a design work guidance processing means 106, for displaying the process template selected from the process template database 102, and for guiding the work along with the working steps, which are defined in the process template; a design work history accumulation means 107, for reflecting such the information of the design history upon the process template, for example, when generating an address for storing a design document produced by the design work tool 104, or when occurring the design backtrack; and a knowledge visualizing means 108 for displaying on a display screen an important information (for example, a failure case in the past) to be transferred to the design worker, in the unit process designated by the design work guidance processing means 106.

With such the system structure as shown in FIG. 1, though the knowledge database 105 is described to be a one integrated or unified one with the knowledge database 105, however it is also possible to construct them to be ones scattered or distributed in plural numbers, as a group of databases.

Also, it is possible to relate the process template registered in the process template database 102 to the information within the knowledge database 105, as the relation information of other process template, in the same manner. In this embodiment, a method is considered, in which the work history of the past (such as, a succeeding case, and a failure case, etc.) is related to a unit process of a new process template.

2. Detailed Embodiment of Process Template

Explanation will be given upon a detailed example of the process template, as well as the data structure thereof.

Figure 2:
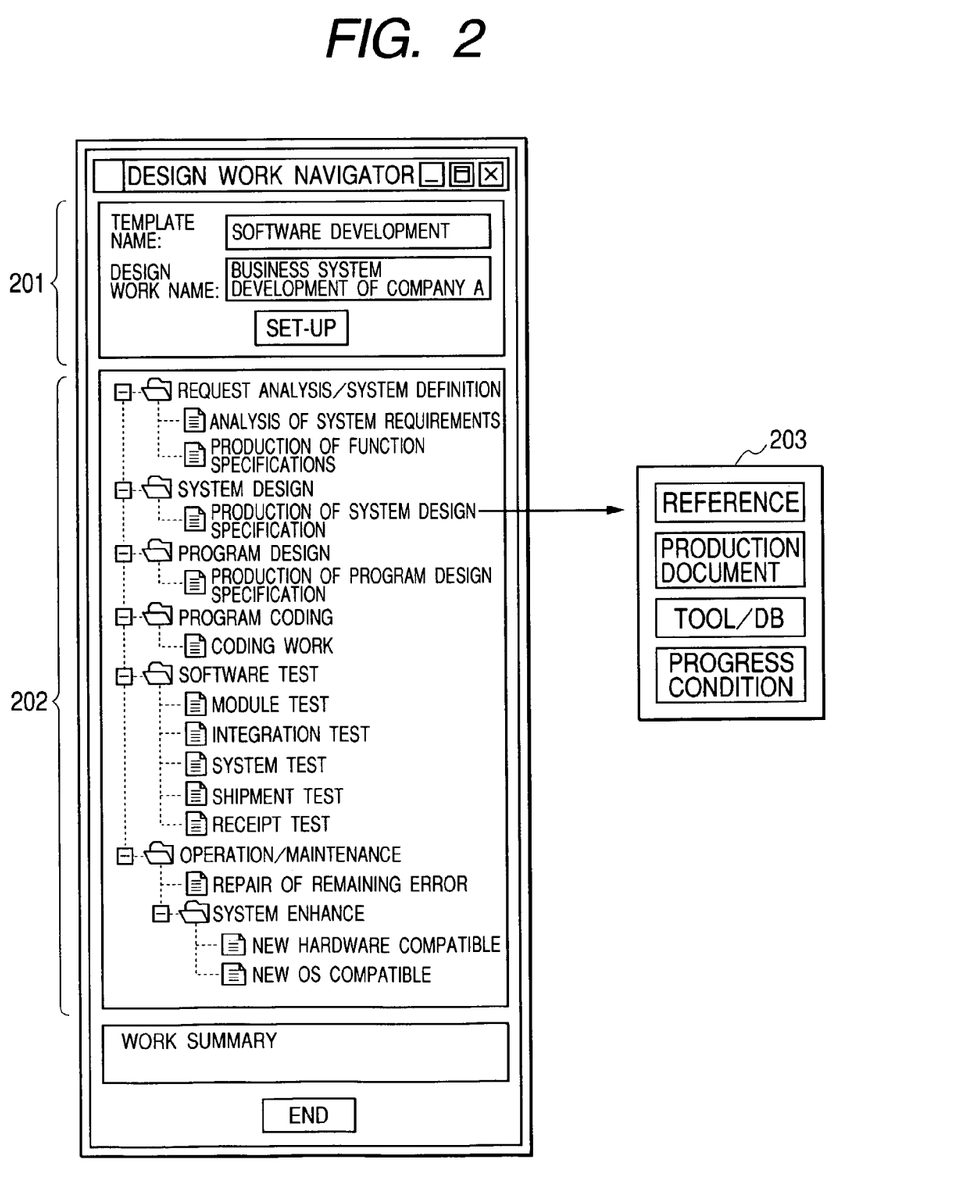
FIG. 2 is a view for showing an example of a process template, according to the present invention.

FIG. 2 is a view for showing an example of the process template. This is a process template, in which a design development process of software is defined in a form of the template.

It is possible to set up a name or title of the template (the software development, in the case of FIG. 2) and/or that of the design work (a system development of company A, in the case of FIG. 2), as property information 201, being in common to those process templates.

The work process can be described, hierarchically, along with the design work processes, as a design work process 202.

There are described brief design process, including definitions of a request analysis/system, a system design, a program design, a program coding, a software test and an operability maintenance, in an example shown in FIG. 2, and a further detailed design processes are defined below that brief process.

Each one of the work processes, which are defined herein, is called by a "unit process". A user executes the design work, which is set up in each the unit process, by indicating an icon of the each unit process, one by one from the above.

When the user picks an icon of the unit process, a popup menu 203 is displayed on the display, which includes commands of "reference", "production document", "tool/database", and "progress condition". If the command "reference" is selected here, a list is displayed of the materials to be referred, so that any material can be selected to refer among them.

When selecting the command "production document", a format list is displayed of the documents, which are to be produced, so that a necessary format can be selected among them, so as to produce the document.

When selecting the command "tool/database", a list is displayed on the design work tools and/or the databases, which are necessary for, so that they can be selected for use.

When selecting the command "progress condition", it is possible to ascertain a condition of progress at the present time, with respect to an original or initial schedule.

Figure 3:
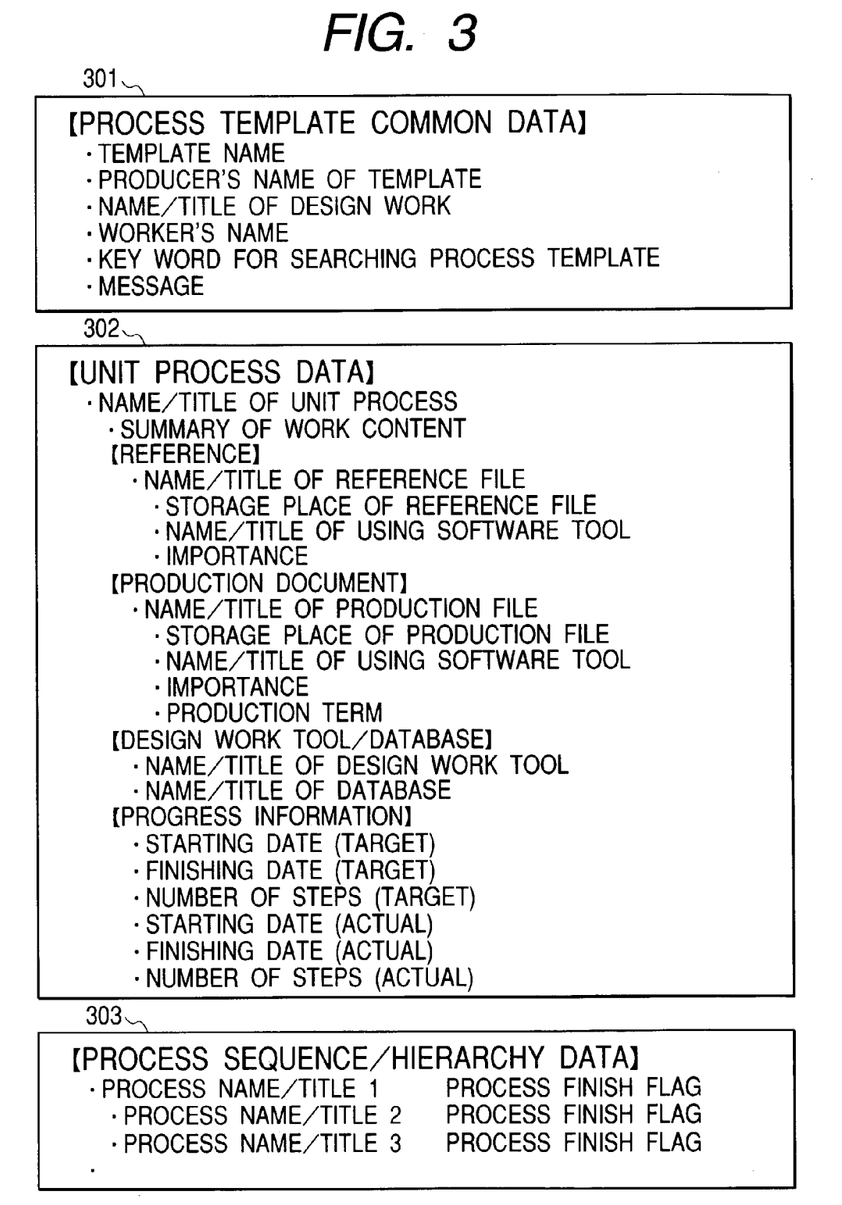
FIG. 3 is a view for showing the data structure of the process template.

FIG. 3 is a view for showing an example of the data structure of the process template. The structure of the process template can be divided, roughly into three (3) parts thereof.

A first part is a process template common data 301, and which is made up with data, such as, a name of the template, a producer's name of the template, a name/title of design work, a worker's name, a key word for searching process template, message, etc., for example.

Among of those mentioned above, the name/title of template and the producer's name of the template are data to be inputted, only when the process template is produced or altered.

Data of the name/title of design work, the worker's name and the key word for searching process template are those to be inputted, when the design work starts after selecting the process template.

The message is data to be inputted when the design work is finished or interrupted, and it is transferred to the design worker thereof when this template is used next time.

A second part is a unit process data 302, and it is defined for the each unit process.

The unit process data 302 describes data therein, which relates to a name/title of unit process, a summary of the process contents, the reference, the production document, the design work tool/database, and the progress condition.

A parameter can be set up on the importance thereof, in particular, relating to the reference(s) and the production document(s) among those, wherein it is determined depending on the necessity to be referred in case of the reference(s), while depending on the priority to be produced in case of the production document(s).

A third part is a process sequence/hierarchy data 303. Herein, description is made on the sequence to be executed along the unit process described in the unit process data 302 mentioned above, as well as, data relating to a parent-offspring relationship between those unit processes. Further, a process completion flag is set up for the each unit process, which is described at a time when the unit process is completed in processing thereof.

With aid of those data, the condition when the design work is interrupted can be reproduced, again, if the design work is started again, even in the case where the design work is stopped on the way thereof.

3. Accumulation Method of Design Work History Information

Herein, explanation will be given on a method for accumulating the information related to the history of design work, by relating it to the process template. The information related to the design history is, such as, the document(s) produced during the design work, the material(s) referred to, and the failure case(s), etc.

Figure 4:
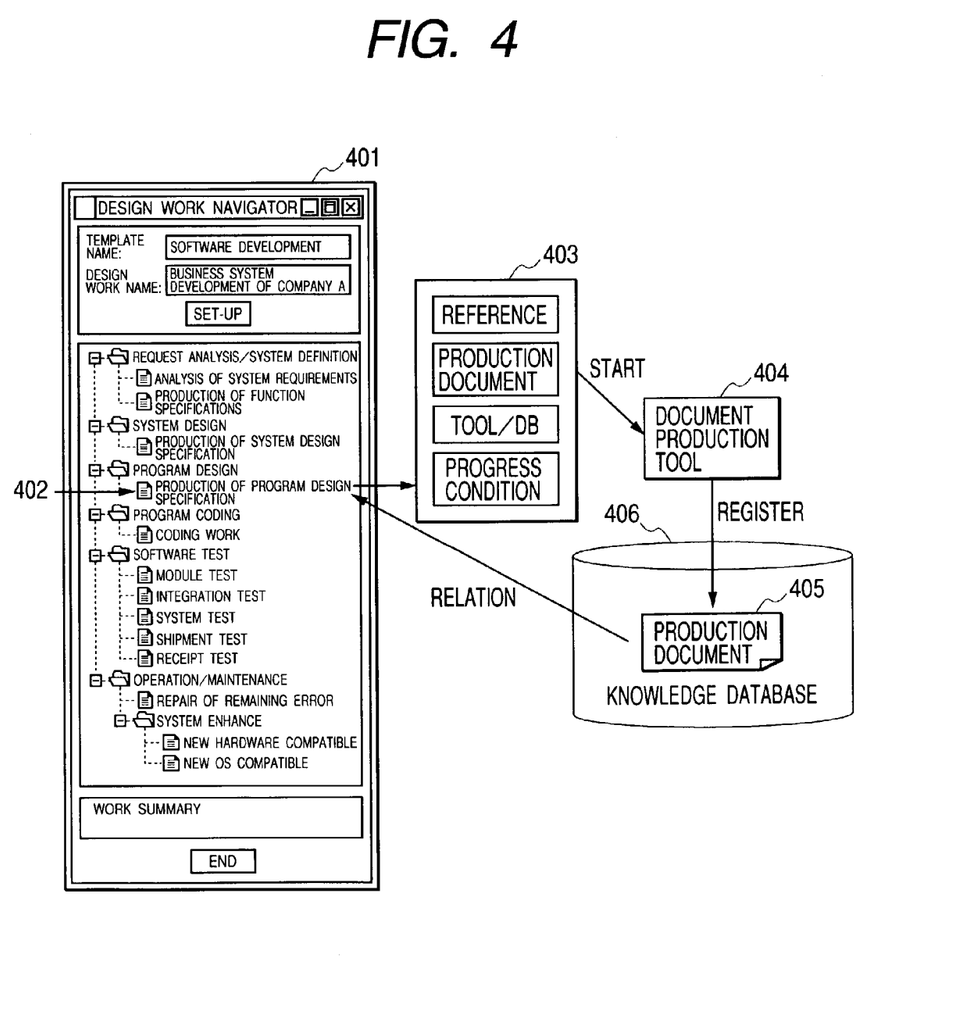
FIG. 4 is a view for explaining a method of relating a material produced during design work with the process template, according to the present invention.

FIG. 4 is a view for explaining the method for relating the document(s) produced during the design work to the process template.

When an icon 402 of the unit process is picked on the process template 401, a popup menu 403 is displayed on the display screen. When a production document command is selected among them, to designate a format of the document to be produced, a document production tool 404 is initiated in relation to the format designated, thereby completing preparation of the production document.

The relation is completed, when both a file name of the production document and an address of storage thereof are written into the unit process being under execution, upon registering the completed production document 405 into the knowledge database 406.

Figure 5:
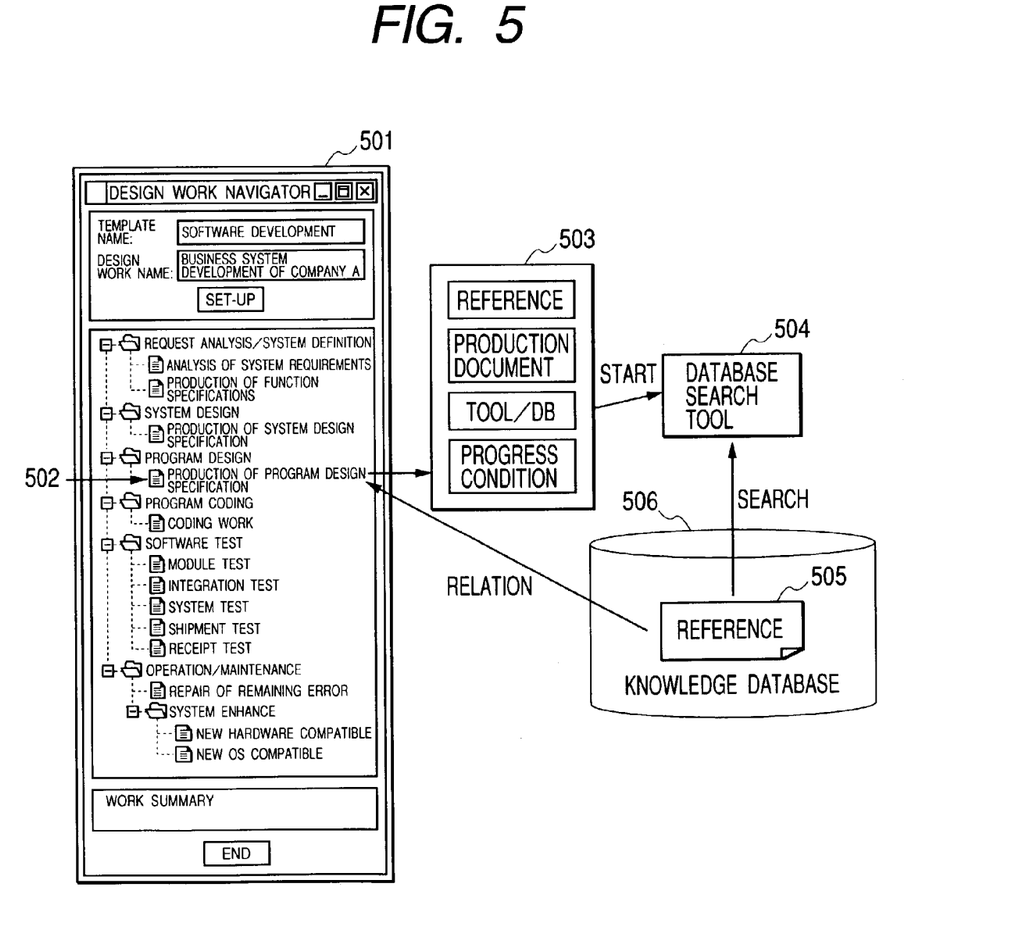
FIG. 5 is a view for explaining a method of relating the material referred during design work with the process template, according to the present invention.

FIG. 5 is a view for explaining a method for relating the material(s) referred in the design work to the process template.

When an icon 502 of the unit process is picked on the process template 501, a popup menu 503 is displayed on the display screen. When a tool/database command is selected among them, to designate a database search tool 504 to be used, the selected database search tool 504 is initiated, thereby completing preparation for search/reference of materials.

The relation is completed, when both a file name of the reference material and an address of storage thereof are written into the unit process, being under execution, about a reference 505, which is searched and/or referenced from the knowledge database 506 with using the database search tool 504.

Next, explanation will be given on an accumulation method of a failure case, by referring to FIGS. 6 and 7.

Figure 6:
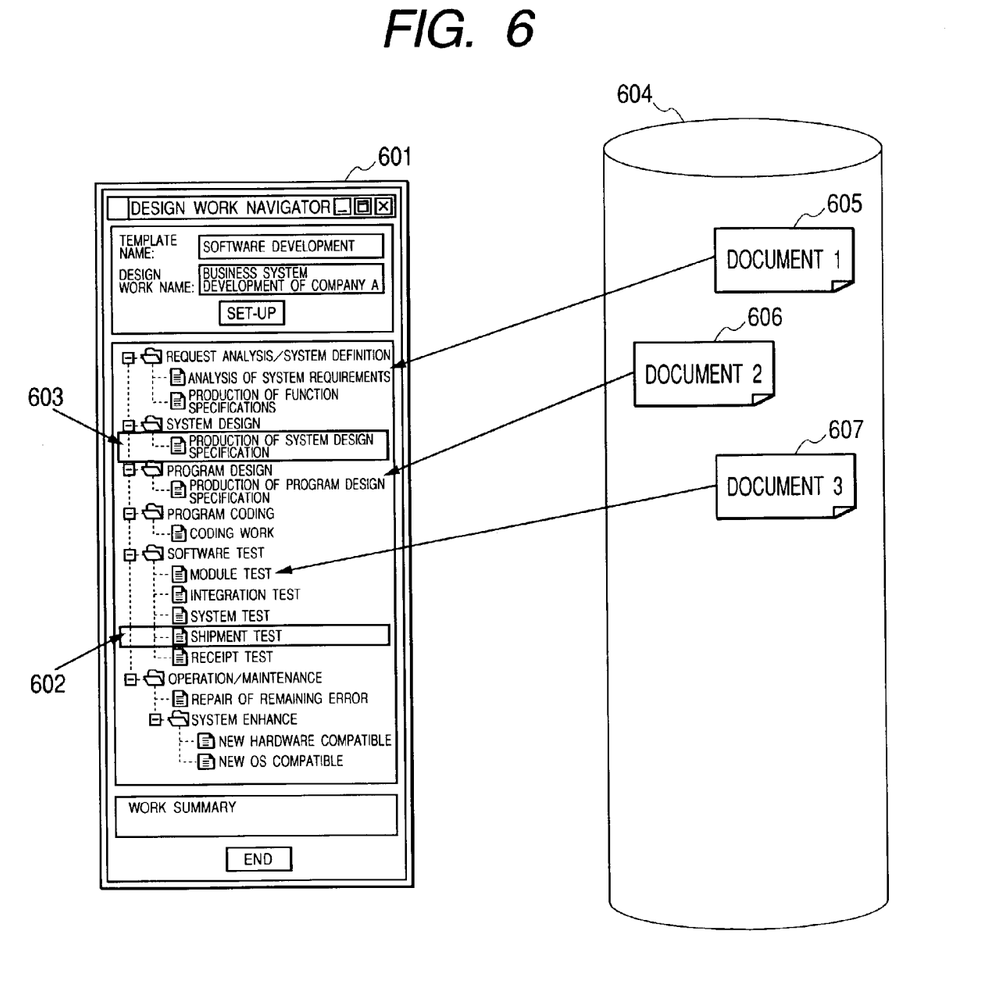
FIG. 6 is a view for showing the process template when failure occurs.

FIG. 6 is a view for showing the condition of the process template when a failure occurs. A unit process 602 indicates the unit process at the time when the failure occurs, while a unit process 603 indicates that, to which the process must turn back due to the failure. Also, the materials 1 through 3 are those, which are already related to the process template, at the time of the unit process 602.

Figure 7:
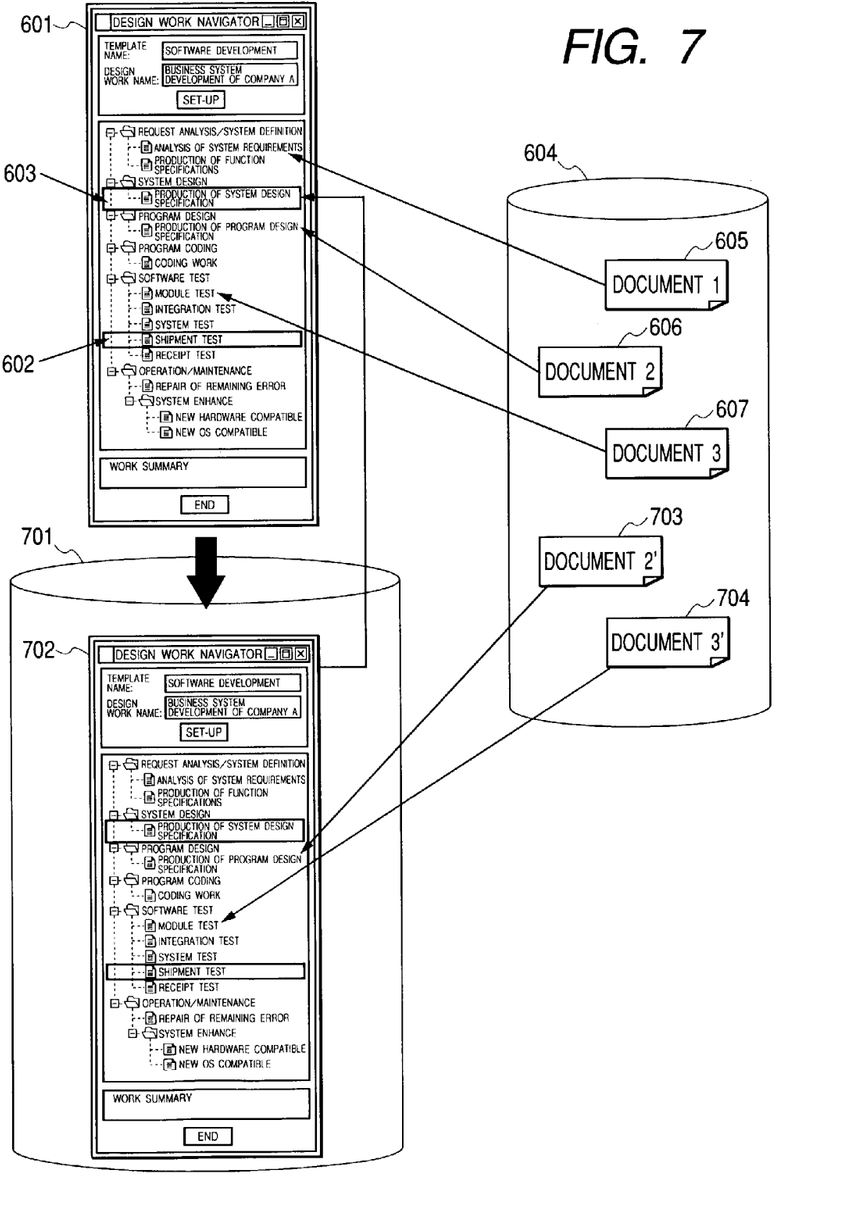
FIG. 7 is a view for showing a method of accumulating design work history information relating to backtrack of design in relation to a unit process 603, when a design worker designates the unit process 603 next to a unit process 602.

FIG. 7 is a view for showing a method for accumulating the design work history information, which is related to the design backtracks, by relating it to the unit process 603, when the design worker designates a unit process 603 next to the unit process 602. When the unit process 603 is designated, which is in advance to the unit process 602, then first of all, a copy is produced of the process template 601, i.e., a copied process template 702.

Next, copies (the materials 2' and 3' in FIG. 7) are produced of the materials (the materials 2 and 3 in FIG. 7), which are newly produced and related to, during the process from the unit process 603 to the unit process 602, and they are registered into the knowledge database 604, while being related to the copied process template 702.

Lastly, when an address for storage of the copied process template 702 is written into the unit process 603 of the process template 601, while registering the copied process template 702 into the process template database 701, the accumulation process is completed about the design work history information when the failure occurs.

In this instance, the design work history information when the failure occurs is registered, as the reference of the process template 601. A parameter of the importance thereof is set at the highest value of the importance, which should be referred to necessarily.

Also, the accumulation process can be set up, so that it will not conducted on the design work history information mentioned above, since the unit process sometimes turns back due to the reasons other than the occurrence of failure.

Further, it is also possible to display an input screen for describing the contents and the reason(s) of that failure into the message data of the copied process template 702, when the unit process 603 is designated.

Figure 8:
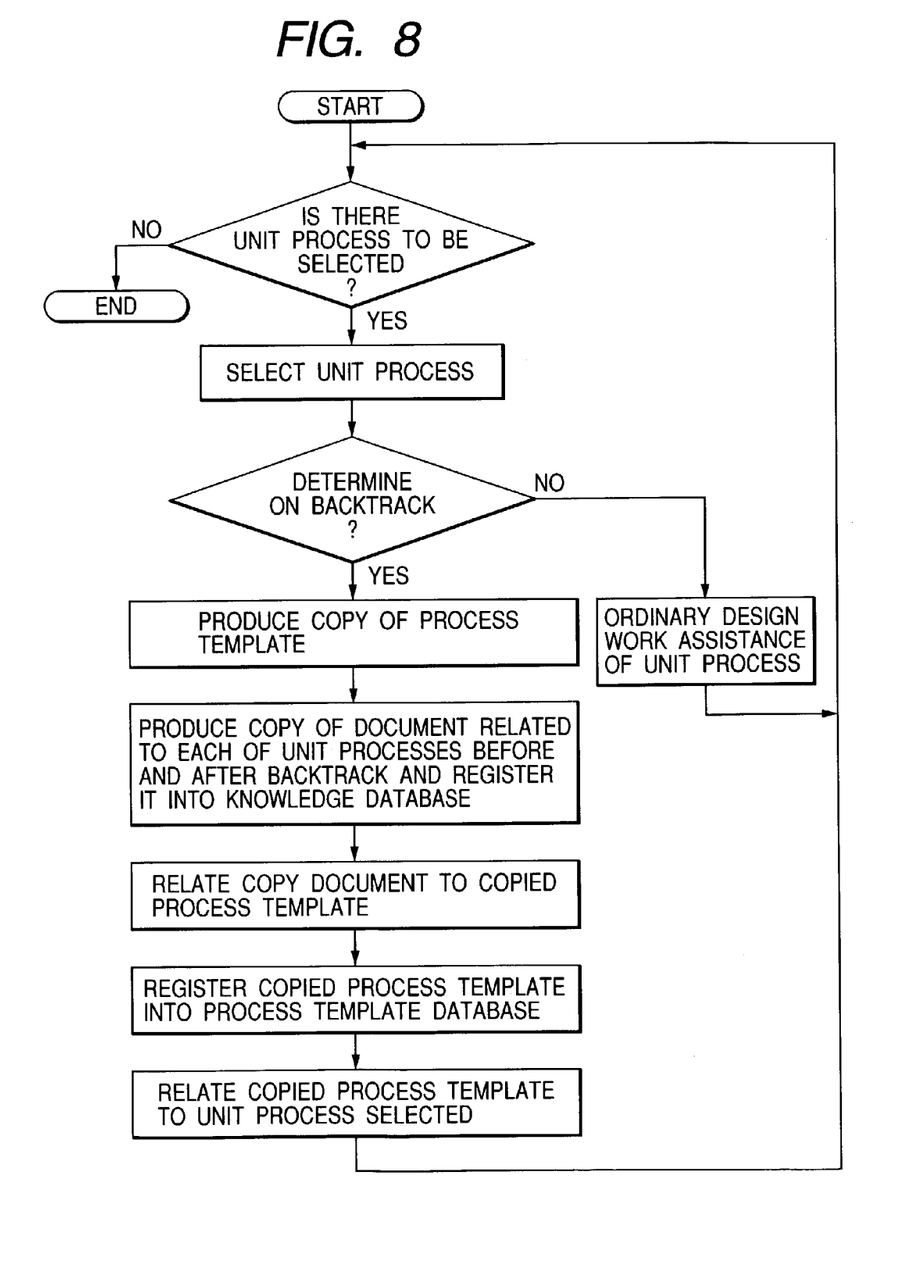
FIG. 8 is a flowchart for showing processing steps of the design work assistance, which allows the backtrack, and design work history accumulation mentioned hereinbefore, in summing up.

FIG. 8 is a flowchart for showing processing steps of the design work assistance permitting backtracking and the accumulation of the design work history, which are explained hereinbefore, in brief.

Determination is made on presence of the unit process to be selected. The process is ended when there is no unit process, nor when no unit process remains to be selected, due to progress of the design work. If there is the unit process to be selected, that unit process is selected.

Determination is made on whether the selected unit process is one or not, which is backtracked. If not being the backtracked one, an ordinary unit process will continue, for assistance of design work.

If the selected unit process is the backtracked one, a copy is made of the process template. Next, a copy is also made of the material, each being related to in each of the unit processes, during from before the backtracking to after the backtracking, thereby being registered into the knowledge database. The materials, which are copied, are related to the copies of the process templates. They are registered into the process template database. The copied process template is related to the selected unit process, thereby continuing the design work assistance of unit process.

Figure 9:
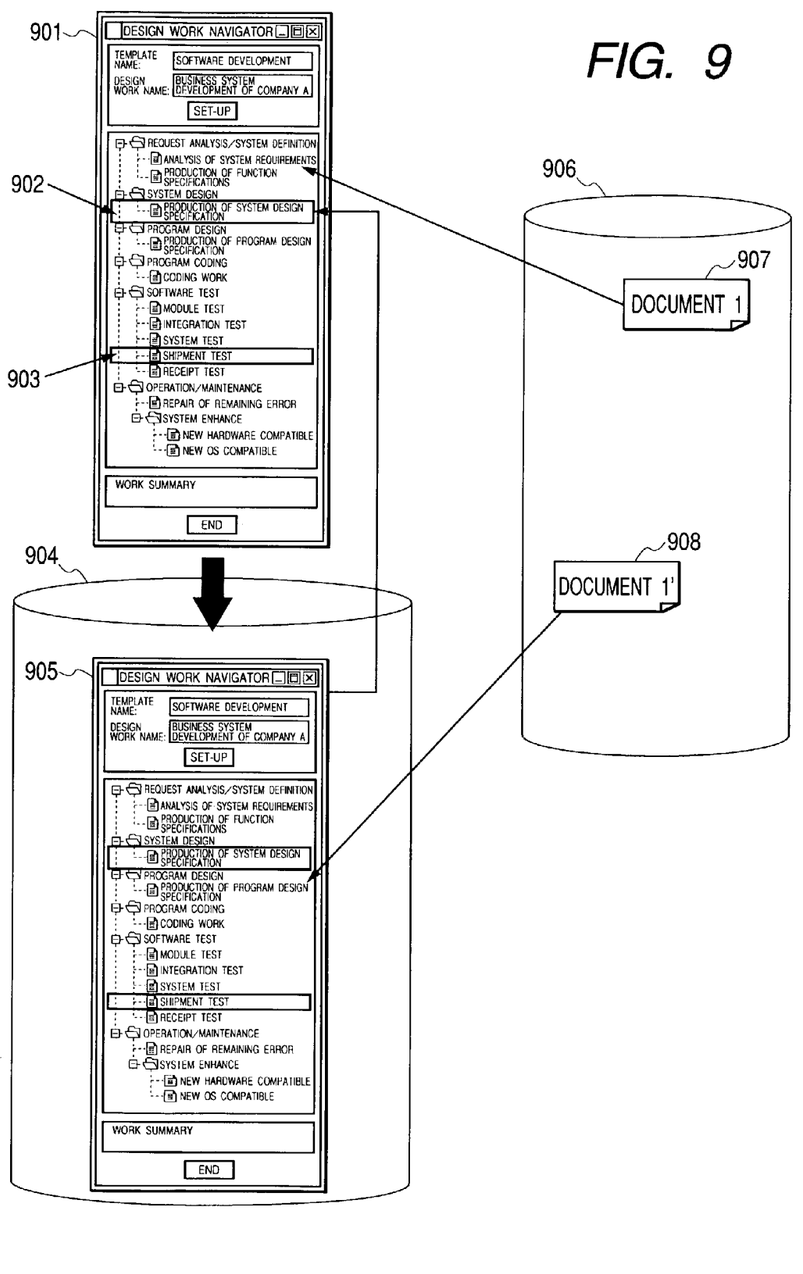
FIG. 9 is a view for explaining a method of accumulating a jump of unit process into the process template, when advancing the design work by omitting a series of continuous unit steps.

FIG. 9 is a view for explaining a method for accumulating jump of the unit process into the template, in case of advancing the design work while omitting the continued unit processes. FIG. 9 shows an example, where a unit process 903 is executed next to a unit process 902 of a process template 901.

In this instance, the history information is accumulated, on the fact that it jumps over the unit process, by relating it to the unit process 902.

When the unit process 903 is designated, which is in advance to the unit process 902 by two (2) or more, first a copied process template 905 is produced of the process template 901, on which is described the fact that the process jumps over from the unit process 902 to the unit process 903.

Next, a copied material (the material 1' in FIG. 9) is made of the material (the material 1 in FIG. 9), which is newly produced and related to, during processed from the unit process 603 up to the unit process 902, and it is registered into the knowledge database 906 while being related to the copy process template 905.

Lastly, when registering the copied process template 905 into the process template database 907, while writing an address for storage of the copied process template 905 into the unit process 902 of the process template 901, the process is completed on accumulation of the information about the jumping case.

4. Design Work Assistance Method with using Failure case

Figure 10:
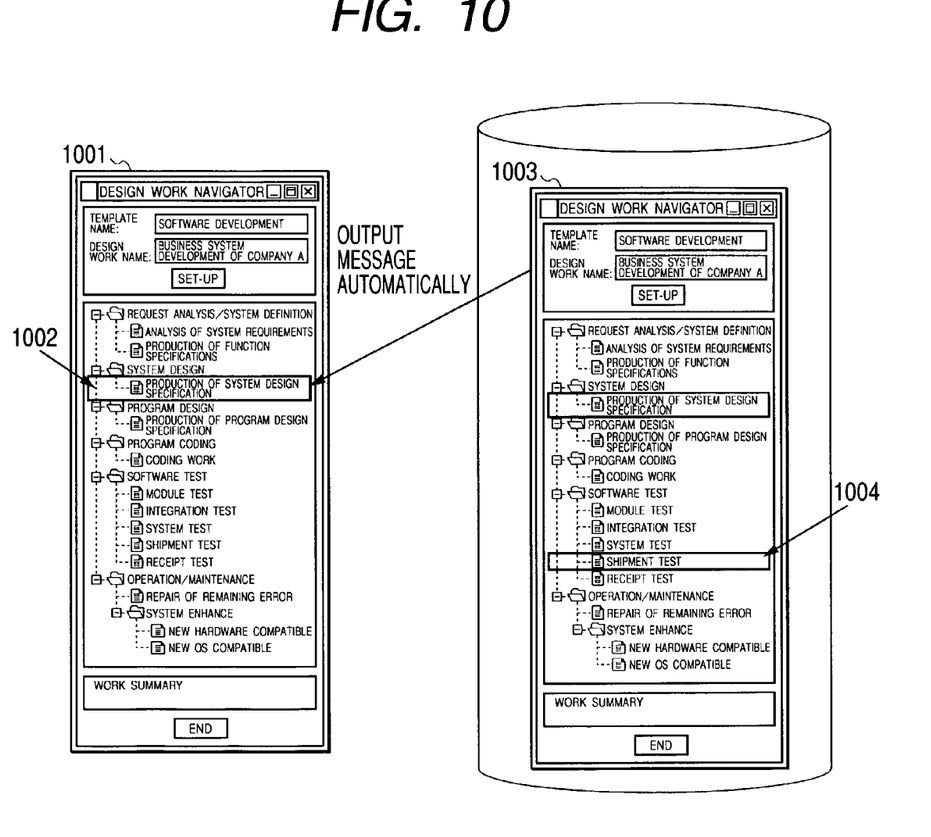
FIG. 10 is a view for explaining a method for prompting an attention to the design worker, not to repeat the same failure, with using the design work history information accumulated when the failures occur.

FIG. 10 is a view for explaining a method of prompting an attention, so that the design worker will not repeat the same failure, with using the design work history information, which is accumulated when the failure occurs.

A process template 1003 is related to a unit process 1002 of a process template 1001, as is a case, in which the failure occurred in the past.

This process template 1003 can be determined to be such the information, that should be transferred to the design worker at the most priority, at the time when the unit process 1002 is designated, since it is set at such the highest value on the importance, that it should be referred to, necessarily.

A method is known, such as a concrete means for transmitting such the information, such as; by displaying the contents and the reasons of the failure on the display screen, which are described as the message data in the process template 1003, for example.

When no message is written in, it is also possible to prompt an attention, such as; by displaying the material (the material after occurrence of failure) related to the last unit process 1004, which is processed on the process template 1003, for example.

As was mentioned above, it is possible to prompt an attention in advance, so that the design worker will not repeat the same failure, as is in the case of occurring that failure in the past, by accumulating the information relating to the history of design works while relating it to the unit process of the process template.

Also, it is possible to analyze particulars and reasons of the failure, afterwards, because the information is accumulated of the design works reaching up to that failure.

According to the present invention, it is possible to guide the design work, with effectively utilizing the design work cases of the past, when the worker selects a unit process other than the next coming unit process, since the design document(s) is/are accumulated, which are produced or referred to in the design work process just before the selection, with being related to either one of two (2) unit processes mentioned above, being in an upper stream from the other.

Also, it is possible to guide the design work, with effectively utilizing the design work cases of the past, when turning back to a unit process B before a unit process A under working, since a copy is made on the process template, which describes the work histories up to the unit process A therein, and since the copied process template is accumulated into the database, with being related to the unit process B.

It is also possible to guide the design work, with effectively utilizing the design work cases of the past, when turning back to a unit process B before a unit process A under working, since the information relating to the reason and/or cause of turning back to the unit process B is accumulated into the database, with being related to the unit process B, in particular, being accumulated the information relating to the failure case into the database.

Further, it is possible to guide the design work, with effectively utilizing the design work cases of the past, when advancing from the unit process A under working up to a unit process C, by jumping over at least one unit process, since a copy is made of the process template, which describes the work history up to the unit process C therein, and since the copied process template is accumulated into the database, with being referred to the unit process A.

It is possible to guide the design work, with effectively utilizing the design work cases of the past, when advancing from the unit process A under working up to a unit process C, by jumping over at least one unit process, since the information relating to the reason and/or cause of omitting the unit process up to the unit process C is accumulated into the database, with being related to the unit process A, in particular, being accumulated the information relating to the failure case into the database.

It is possible to guide the design work, with effectively utilizing the design work cases of the past, when turning back to the unit process B before the unit process A under working, since a copy is made of the process template, which describes the work history up to the unit process A therein, and the copied process template is accumulated into the database, with being related to the unit process B, and when advancing from the unit process A under working up to the unit process C, by jumping over at least one unit process, since a copy is made of the process template, which describes the work history up to the unit process C therein, and since the copied process template is accumulated into the database, with being related to the unit process A.

It is also possible to guide the design work, with effectively utilizing the design work cases of the past, when turning back to the unit process B before the unit process A under working, since the information relating to the reason and/or cause of omitting the unit process up to the unit process B is accumulated into the database, with being related to the unit process B, and when advancing from the unit process A under working up to a unit process C, by jumping over at least one unit process, since a copy is made of the process template, which describes the work history up to the unit process C therein, and since the copied process template is accumulated into the database, with being related to the unit process A, in particular, being accumulated the information relating to the failure case into the database.

With the provision of a knowledge visualizing means for transmitting the design history information of the past to a user, which is related to the unit process mentioned above, when the user starts working of the unit process, it is possible to prompt an attention to the design worker, in particular, to transmit such the information that the worker will not repeat the failure of the past, again, in advance thereof and timely.

As a result, repetition of the same failure can be reduced greatly.

Also, with accumulation of the design work histories, it is also possible to lighten the design worker from the load of referring the necessary materials and registering the produced documents during the design work.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A design work assistance computer, programmed to implement design work assistance functions comprising:
    guiding design work, sequentially along a process template defining unit processes of the design work therein, and
    accumulating a design work history when a worker selects a unit process other than a next unit process defined in the template, the design work history including:
        a design document produced or referred in process of the design work up to just before the selection, and
        a relationship of the design document to either one of the other and next unit processes, one of which is up stream from the other in the template sequence.

2. A design work computer, as in claim 1, comprising a knowledge visualizing means for displaying the design history information of the past, which is related to said selected unit process, when the user starts working of the selected unit process.

3. A design work assistance computer, programmed to implement design work assistance functions comprising:
    guiding design work, sequentially along a process template defining unit processes of the design work therein, and
    accumulating a design work history by:
        producing a copy of a process template, which describes work history up to a unit process A therein, and
        accumulating the copied process template, by relating the copied process template to a unit process B before the unit process A, when a process flow turns back to the unit process B from work on the unit process A.

4. A design work assistance computer, as in claim 3, wherein said design work history accumulating accumulates information relating to a reason and/or cause of turning back, when the process flow turns back to the unit process B before the unit process A, by relating the information to the unit process B.

5. A design work assistance computer, as in claim 4, comprising a knowledge visualizing means for displaying the design history information of the past, which is related to said unit process B, when the user starts working of the unit process B.

6. A design work computer, as in claim 3, comprising a knowledge visualizing means for displaying the design history information of the past, which is related to said unit process B, when the user starts working of the unit process B.

7. A design work assistance computer, programmed to implement design work assistance functions comprising:
    guiding design work, sequentially along a process template defining unit processes of the design work therein, and
    accumulating a design work history by:
        producing a copy of a process template, which describes work history up to a unit process C therein, and
        accumulating the copied process template, by relating the copied process template to a unit process A, when advancing to the unit process C by jumping over at least one unit process from work on unit process A.

8. A design work assistance computer, as in claim 7, wherein said design work history accumulating accumulates information relating to a reason and/or cause of omitting the unit processes up to the unit process C, when advancing to the unit process C by jumping over at least one unit process from the unit process A, by relating the information to the unit process A.

9. A design work computer, as in claim 8, comprising a knowledge visualizing means for displaying the design history information of the past, which is related to said unit process A, when the user starts working of the unit process A.

10. A design work assistance computer, as in claim 7, comprising a knowledge visualizing means for displaying the design history information of the past, which is related to said unit process A, when the user starts working of the unit process A.

11. A design work assistance computer, programmed to implement design work assistance functions comprising:
    guiding design work, sequentially along a process template defining unit processes of the design work therein, and
    accumulating a design work history by:
        producing a copy of a process template, which describes work history up to a unit process A therein, and accumulating the process template copied up to unit process A, by relating the copied process template up to unit process A to a unit process B, when a process flow turns back to a unit process B before the unit process A from work on the unit process A, and
        producing a copy of a process template, which describes work history up to a unit process C therein, and accumulating the process template copied up to unit process C, by relating the copied process template up to unit process C to the unit process A, when advancing to the unit process C by jumping over at least one unit process from work on the unit process A.

12. A design work assistance computer, as in claim 11, wherein said design work history accumulating:

accumulates information relating to a reason and/or cause of the turning back, when turning back to the unit process B before the unit process A, by relating the information to the unit process B, and accumulates information relating to a reason and/or cause of omitting the unit processes up to the unit process C, when advancing to the unit process C by jumping over at least one unit process from the unit process under working, by relating the information relating to reason and/or cause of omitting unit processes to the unit process A.

13. A design work assistance apparatus, as described in the claim 12, comprising a knowledge visualizing means for displaying the design history information of the past, which is related to one of said unit processes, when the user starts working of the one unit process.

14. A design work computer, as in claim 11, comprising a knowledge visualizing means for displaying the design history information of the past, which is related to one of said unit processes, when the user starts working of the one unit process.

* * * * *